(12) United States Patent
Neiconi et al.

(10) Patent No.: US 6,352,025 B1
(45) Date of Patent: Mar. 5, 2002

(54) SOLDER PRINTING APPARATUS

(75) Inventors: Ovidiu Neiconi, Boynton Beach; Richard Lee Mangold, Lake Worth; Christopher Lee Becher, Boynton Beach; John Patrick Hunt, Lake Worth, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/652,343

(22) Filed: Sep. 1, 2000

(51) Int. Cl.⁷ .............................................. B05C 17/06
(52) U.S. Cl. ........................ 101/126; 101/123; 101/485
(58) Field of Search ................................. 101/114, 123, 101/124, 126, 127, 127.1, 129, 484, 485, 486

(56) References Cited

U.S. PATENT DOCUMENTS

| | | | |
|---|---|---|---|
| 4,978,414 A | * | 12/1990 | Ohtani et al. ............ 101/127.1 |
| 5,232,736 A | | 8/1993 | Tribbey et al. |
| 5,540,742 A | * | 7/1996 | Samgyoji et al. ........... 101/129 |
| 5,628,574 A | * | 5/1997 | Crowley .................... 400/621 |
| 5,724,889 A | | 3/1998 | Aun et al. |
| 5,752,446 A | * | 5/1998 | Squibb ....................... 101/486 |
| 5,899,144 A | * | 5/1999 | Parks ......................... 101/129 |
| 5,901,646 A | * | 5/1999 | Walker et al. .............. 101/123 |
| 6,230,619 B1 | * | 5/2001 | Yamazaki et al. .......... 101/129 |

* cited by examiner

*Primary Examiner*—Ren Yan
(74) *Attorney, Agent, or Firm*—Randi L. Dulaney

(57) ABSTRACT

A solder printing apparatus (40) for use within a solder printer (34) includes a vision and alignment mechanism (44), a steering mechanism (46), a vacuum conveyer (48), and a tension roller assembly (42). The vision and alignment mechanism (44) controls the position of the flexible tape (10) and sends a signal to the steering mechanism (46). The steering mechanism (46) adjusts the position of the flexible tape (10) in response to receiving the signal from the vision and alignment mechanism (44). The vacuum conveyer (48) holds and advances the flexible tape (10). The tension roller assembly (42) maintains tension in the flexible tape (10).

9 Claims, 9 Drawing Sheets

SOLDER PRINTING APPARATUS

BACKGROUND OF THE INVENTION

1. Field of the Invention

This invention relates in general to solder printing apparatus for the manufacture of portable products and specifically to solder printing apparatus for processing flexible tapes.

2. Description of the Related Art

In the expanding world of consumer electronics, the manufacture of portable products such as cellular telephones and pagers requires that the product designers incorporate the maximum performance into the least space and at the lowest cost. To fulfill the performance requirements of such products, yet remain small and affordable, a blend of highly integrated silicon and software, chip packaging, circuit board technologies and flexible circuits are commonly used.

Integrated circuits are the greatest enabling technology for size reduction; however, even with greater integration, circuit board technology is arguably the single factor most fundamentally affecting the level of product densification.

Manufacturing electronic circuits on rigid printed circuit boards (PCBs) is well known. The PCB, for example, is a composite of glass and epoxy, polyamide, or similar dielectric. Rigid PCBs have provided an effective manufacturing method for consumer products including cellular telephones, pagers, watches and hand-held calculators, However, as miniaturization continues to be a driving force in the technology market, new methods are under investigation to determine how to reduce the thickness of PCBs and more importantly how to manufacture new PCB technologies reliably and at low cost. As a byproduct of these investigations, engineers have turned their interest to the use of flexible substrates for carrying a multiplicity of circuits that traditionally were carried by rigid PCBs. Such substrates are constructed of, for example, polyamide, polyester, or similar material, typically having a thickness in the range of 0.0254 millimeter (0.001 inch) to 0.127 millimeter (0.005 inch), and are readily available and cost effective. Film circuitry (also known as flexible circuits) is the key to solving the related mechanical and cost issues of the manufacture of small portable products. Its cost effective construction allows for fine lines and spacing, small via interconnects, and mechanical freedom for not only two-dimensional structure but a full range of three-dimensional possibilities.

Although flexible circuits have the attractive feature of being inexpensive, their lack of rigidity has made manufacturability a complex challenge. Presently, the manufacture of dense circuits, which include fine-pitch surface mount devices, is expensive and not easily repeatable in a reliable fashion over large volumes of flexible circuits. Due to the inherent flexibility of the flexible circuitry, it is very difficult to use standard manufacturing printing processes. Currently available solder stencil printing equipment is capable of running rigid substrates with or without a carrier (i.e. boat, pallet) by utilizing a conveyorized material handling system. Substrates are moved into a working area from an external location, positioned, printed and the completed circuits are removed by a conveyorized system. It is possible, but very difficult, to adapt a conventional printing equipment for flexible circuitry. The design will be complex in order to hold the flexible tape flat and allow for advancing and steering of the flexible tape during normal operation. In any precise continuous tape application it is required that the flexible tape is maintained under constant tension during handling and/or printing.

There are several key challenges relating to continuous flexible tape advancement, printing and surface mount device (SMD) assembly of flexible circuits. One challenge is the advancement of the flexible flexible tape accurately under low tension in a continuous format without having sprocket holes on the exterior of the active circuitry. Another challenge is diverting the flexible circuits before and after the one being printed away from the solder stencil. A third challenge is keeping the flexible tape flat while allowing for smooth flexible tape advancement and steering. Another challenge is using standard solder printing equipment with a minimum of modification. A last challenge is using easy and cost effective methods to install onto printers that have a standard conveyor system.

What is needed is a design consistent with the transport mechanics and dimensional stability that is required by the existing manufacturing process equipment which also meets the key challenges previously mentioned.

DETAILED DESCRIPTION OF THE INVENTION

Figure 1:
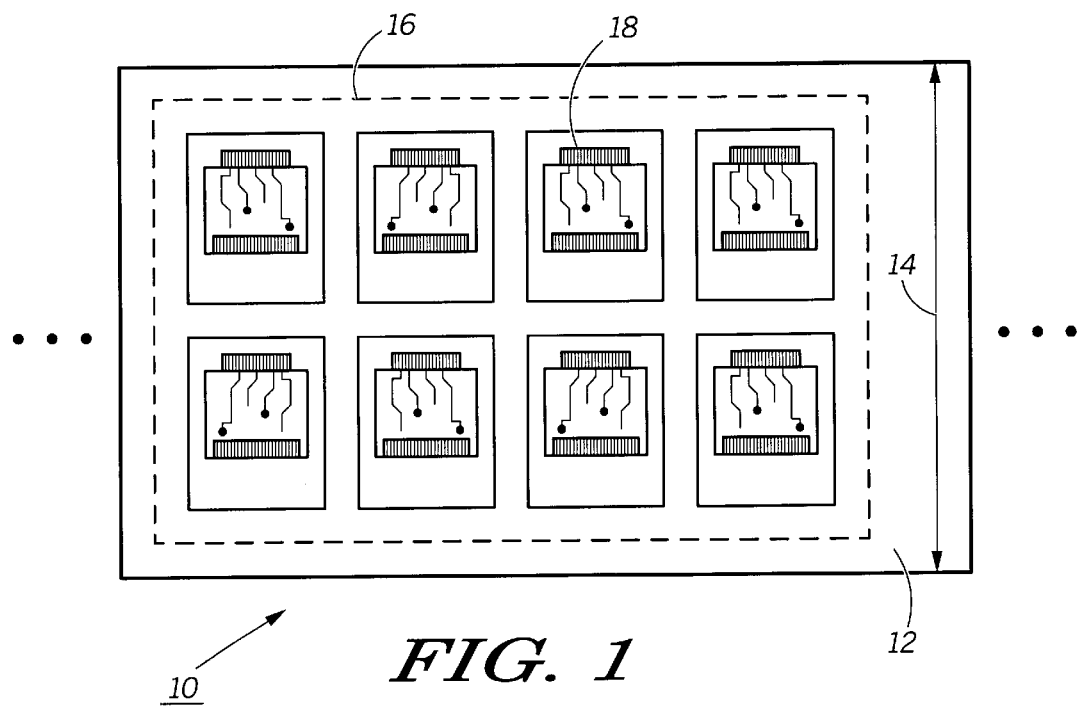
FIG. 1 is an illustration of a flexible tape.

Before introducing the solder printing apparatus 40 (shown in FIG. 5), a flexible tape 10 processed by the solder printing apparatus 42 will be described and illustrated in FIGS. 1 through 3. FIG. 1 illustrates a front side 12 of the flexible tape 10, which is preferably a continuous flexible tape used in a reel-to-reel manufacturing assembly process. Reel-to-reel manufacturing assembly process is a manufacturing process wherein a continuous flexible tape is processed from one spooled carrier, through the manufacturing process, to a second spooled carrier. This eliminates the cost and time of processing single circuit substrates. Alternatively, the flexible tape 10 can be a single panel of an individual flexible circuit. One skilled in the art will recognize that the flexible tape 10 can be used in either of the manufacturing processes described above or an equivalent.

The flexible tape 10 has a tape width 14 typically measuring 35, 70 or 150 millimeters (1.37, 2.76, and 5.9 inches). The flexible tape 10 preferably comprises an adhesiveless polyamide substrate utilizing double-sided copper and preferably a protective surface finishing agent having a twenty five to fifty micrometer (985 to 1968 micro inch) thickness and a patterned copper foil attached providing an electrical interconnect for connecting signal lines. Patterned within the flexible tape 10 is a plurality of flexible circuits 16 such as a flexible circuit 18.

Figure 2:
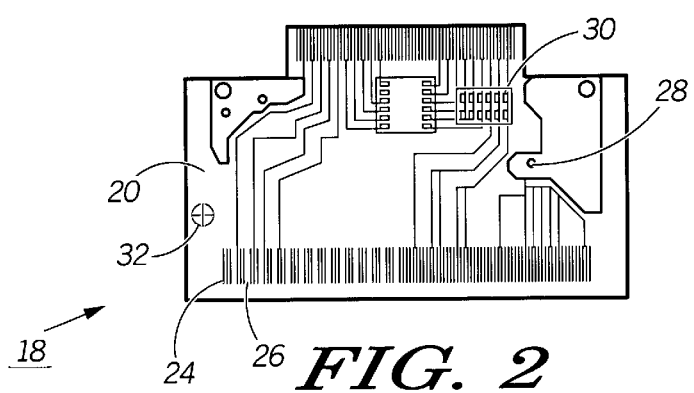
FIG. 2 is an illustration of a top side of a flexible circuit for use in the flexible tape of FIG. 1.
Figure 3:
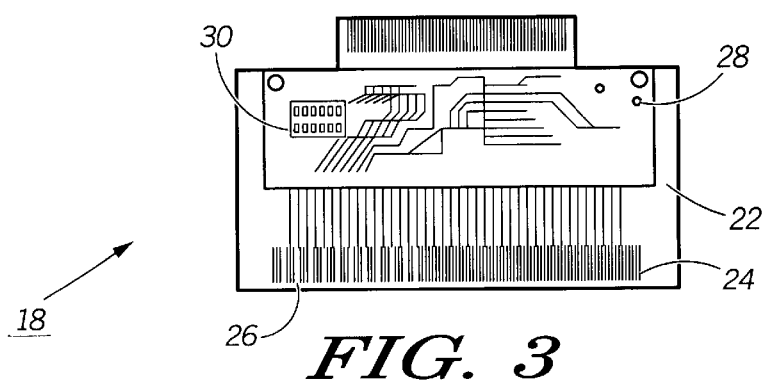
FIG. 3 is an illustration of a bottom side of a flexible circuit for use in the flexible tape of FIG. 1.

FIG. 2 illustrates a top side 20 of the flexible circuit 18. FIG. 3 illustrates a bottom side 22 of the flexible circuit 18. The flexible circuit 18 of FIGS. 2 and 3 incorporates a plurality of lines 24 and a plurality of spaces 26 typically of 0.0762 millimeters (0.003 inch) thickness, a plurality of vias 28 typically of 0.1016 millimeters (0.004 inch) thickness and a plurality of capture pads 30 typically of 0.254 millimeters (0.01 inch) thickness. The patterned copper foil interconnects through the plurality of lines 24 a plurality of discrete components assembled to the flexible circuit 18 during the manufacturing process to the plurality of capture pads 30. The top side 20, as illustrated in FIG. 2, further includes at least one global mark 32 for use in vision alignment of the flexible circuit 18 during the manufacturing process. A photo-imagable cover coat or solder mask is applied to both the top side 20 and the bottom side 22 of the flexible circuit 18 with the exception of the plurality of capture pads 30 and surrounding areas. The thickness of the flexible circuit 18 including the cover coat is typically 0.1016 millimeters (0.004 inch). The flexible tape 10 as described above and illustrated in FIGS. 1 through 3 provides for a cost-effective manufacturable package.

Figure 4:
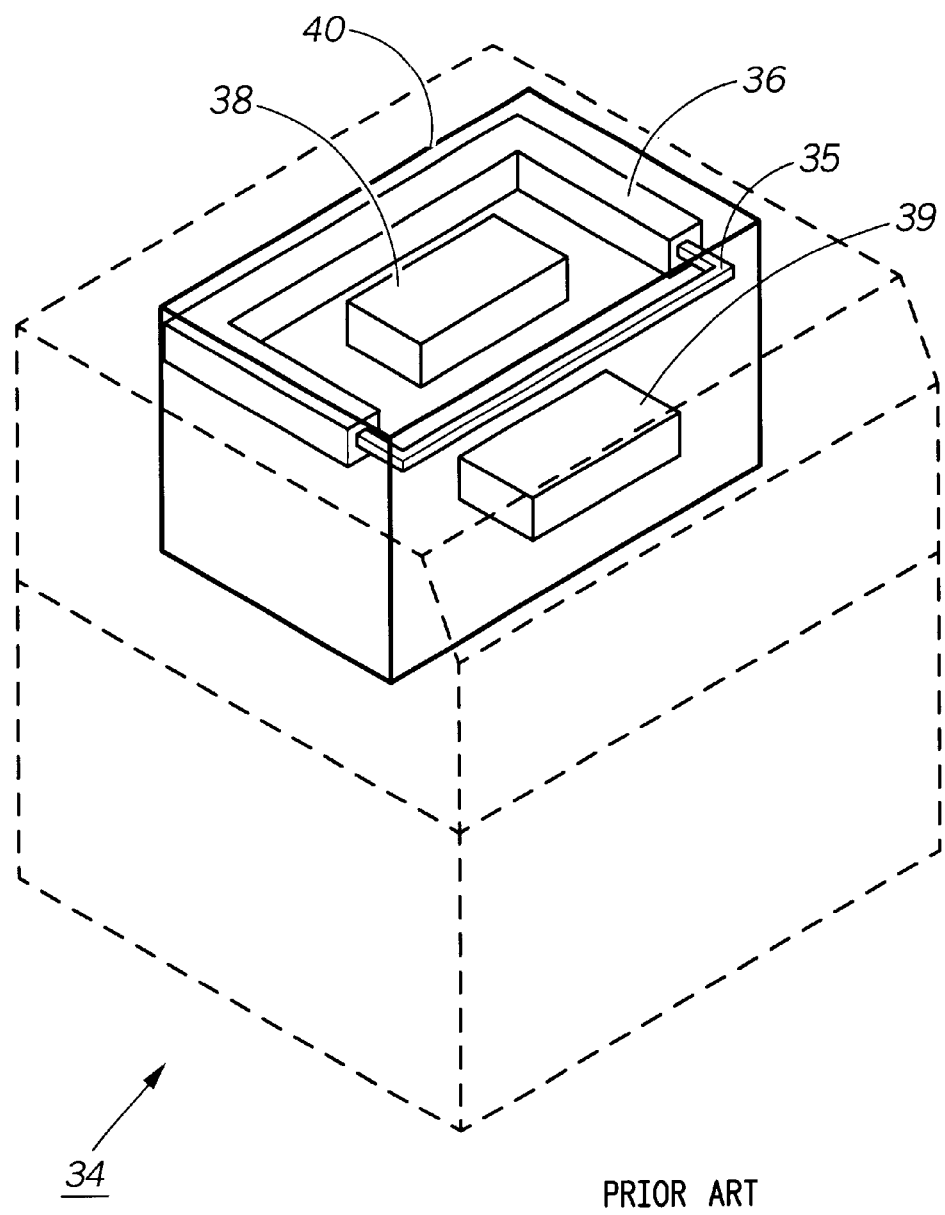
FIG. 4 is an illustration of a conventional solder printer.

FIG. 4 illustrates one embodiment of a conventional solder printer 34. The solder printing apparatus 40 in accordance with the present invention works within the conventional solder printer 34 to perform the required functionality. The conventional solder printer 34 includes a solder stencil 35, a frame 36, a vision system 38, a z-axis plate 39, and the solder printing apparatus 40. The vision system 38 can be, for example, a camera. It will be appreciated by those skilled in the art that other vision mechanisms can be utilized for the vision system 38, and that additional vision mechanisms of the same or alternative type can be added as required to handle the requirements of the vision system 38.

The vision system 38 captures the location of the global mark 32 on the top side 20 of the flexible circuit 18 and also captures the location of a solder stencil global mark on the solder stencil 35 used in the solder printing process and compares them. The frame 36 is capable of x-y theta adjustment. Through the frame 36, the conventional solder printer 34 makes the necessary adjustments to the location of the solder stencil 35 so that the two location marks match. Once the two locations marks match, the vision system 38 retracts to allow for the remainder of the processing as described below.

Figure 5:
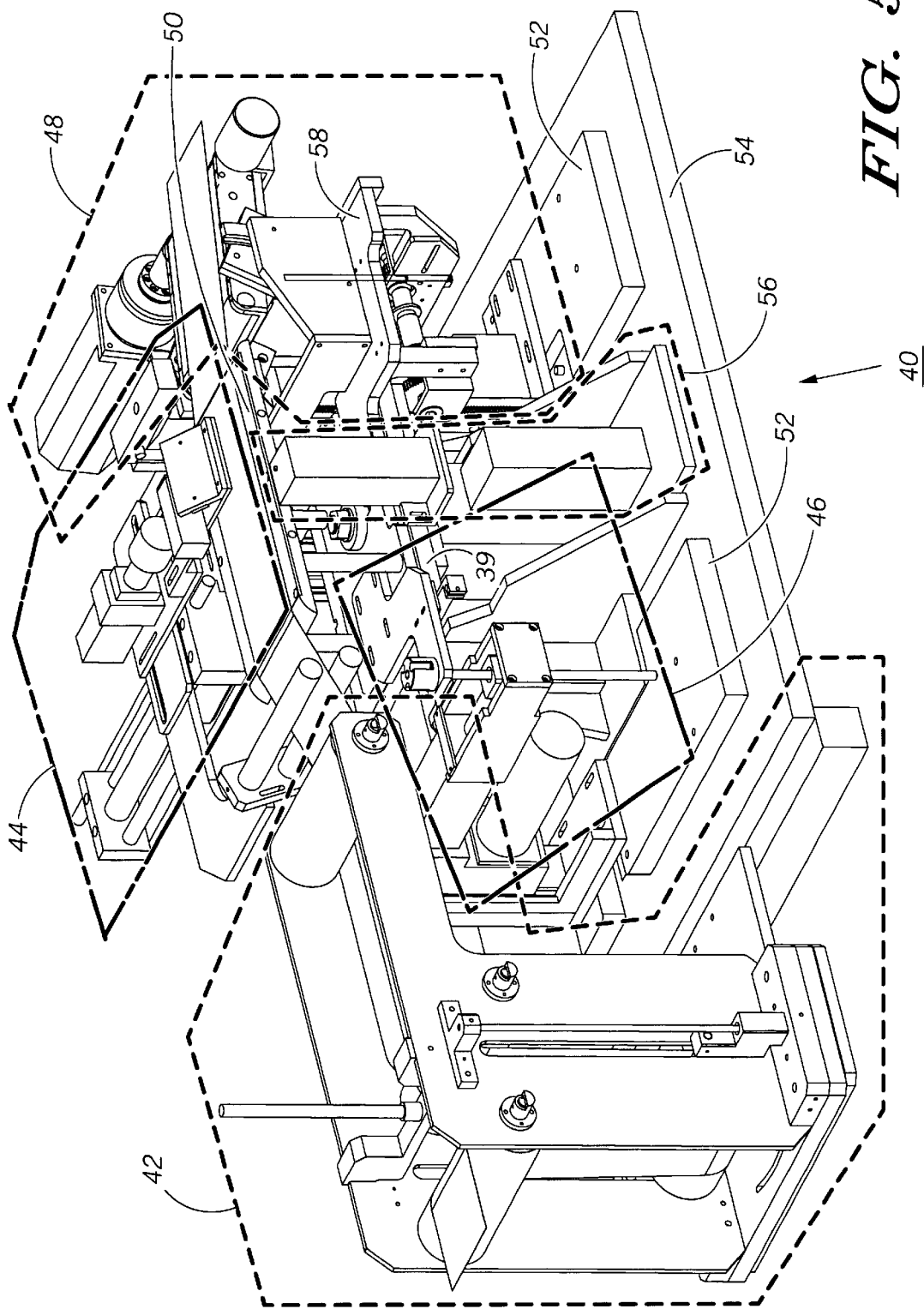
FIG. 5 illustrates a solder printing apparatus for use within the conventional solder printer of FIG. 4 in accordance with the present invention.

FIG. 5 illustrates the solder printing apparatus 40 in accordance with the present invention. The solder printing apparatus 40 includes a tension roller assembly 42, a vision and alignment mechanism 44, a steering mechanism 46, a vacuum conveyer 48, a printing platform 50, a plurality of mounting plates 52, a mounting base 54, a lift mechanism 56, and a theta steering platform 58.

The solder printing apparatus 40 receives the flexible tape 10 from a previous manufacturing processing equipment. The flexible tape 10 is strung through the solder printing apparatus 40. The vacuum conveyer 48 holds and advances the flexible tape 10 in a predetermined amount. The vision and alignment mechanism 44 controls the position of the flexible tape 10 to compensate for tape drift, which occurs during the processing. The vision and alignment mechanism 44 sends a signal to the steering mechanism 46 with the information of compensation required. The steering mechanism 46 then adjusts the position of the flexible tape 10 accordingly. Once the adjustment is completed, the solder printing process begins. The tension roller assembly 42 takes up the slack in the continuous roll of flexible tape 10 while the z-axis plate 39 moves the flexible tape 10 upwards towards the solder stencil 35.

Most of the continuous flexible tape applications for solder printing require the flexible tape 10 to be maintained under constant tension during handling and/or printing. The tension roller assembly 42 at the entrance of the solder printing apparatus 40 and the vacuum conveyor 48 at the exit of the solder printing apparatus 40 in accordance with the present invention provide a novel method to maintain constant tension of the flexible tape 10.

The vacuum conveyor 48 contributes to the steering of the flexible tape 10; and along with the printing platform 50 is mounted on the theta steering platform 58 that constantly compensates the direction of the flexible tape 10 during flexible tape advancement. A line controller (not shown) engages the flexible tape 10 on the vacuum conveyor 48 by turning on the conveyer's vacuum generator (not shown) at a relative starting position and the vacuum conveyer 48 turns, which moves the flexible tape 10 in the X direction a specified distance. The vision and alignment mechanism 44 checks the location of the global mark 32 on the top side 20 of the flexible circuit 18 of the flexible tape 10. The global mark 32 is required to be within a predetermined calibration range and a correction is applied if necessary. The correction includes both theta and x-direction correction.

When the flexible tape advancement cycle is completed the vision and alignment mechanism 44 retracts to a home position and the printing process begins. A second vacuum generator (not shown) on the printing platform 50 is turned on and the printing platform 50 is lifted up toward the solder stencil 35 using the z-axis plate 39 after proper vision alignment between the flexible tape 10 and the solder stencil 35. When the printing platform 50 starts to lift, the vacuum conveyor 48 moves along a circular pair of steel tracks, in order to prevent the already printed flexible circuits from coming in contact with the solder stencil 35. This circular motion also serves the purpose of maintaining the proper flexible tape tension without disturbing the fixed position of the flexible circuit 18 being printed. During the lifting motion the tension of the flexible tape 10 at the entrance side of the solder printing apparatus 40 is achieved through the tension roller assembly 42.

The solder printing apparatus 40 has the capability of contacting the flexible tape 10 on the bottom side 22, holding the very thin (i.e. 0.005 inch) film of the flexible tape 10 flat for processing, and minimizes the required manufacturing floor space. The combination of vacuum conveyor 48 and the vision and alignment mechanism 44 guarantees the accurate flexible tape advancement under low tension.

Figure 6:
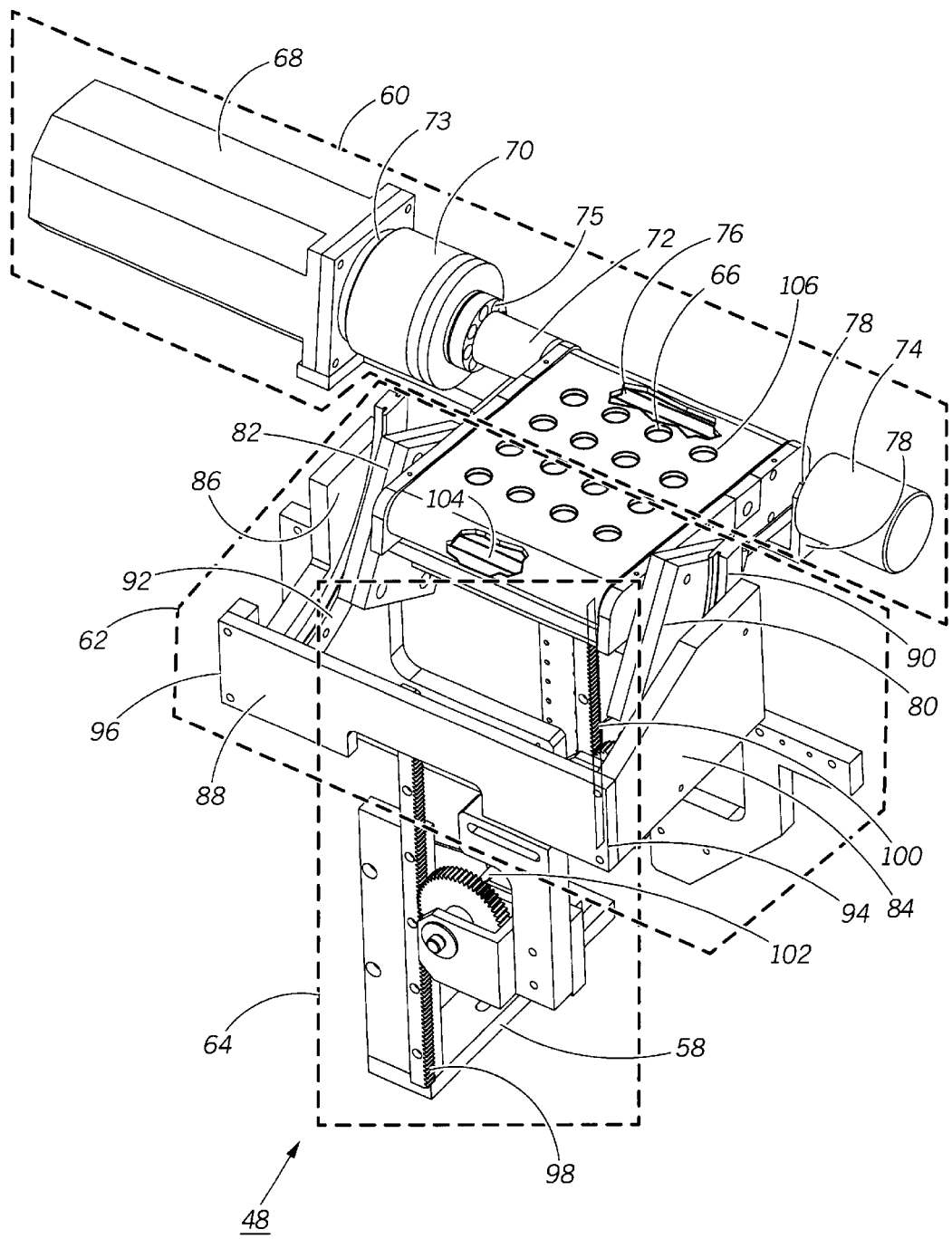
FIG. 6 illustrates a vacuum conveyer for use in the solder printing apparatus of FIG. 5 in accordance with the present invention.

FIG. 6 illustrates a preferred embodiment of the vacuum conveyer mechanism 48 utilized in the solder printing apparatus 40. The vacuum conveyer mechanism 48 includes a motor assembly 60, a carrier assembly 62, a motion synchronizer 64 and a conveyer belt 66.

The motor assembly 60 of the vacuum conveyer 48 preferably includes a servomotor 68, a harmonic drive 70, a flexible coupler 72, and a counterweight 74. The servomotor 68 produces the power to drive the movement of the conveyer belt 66. The harmonic drive 70 is mechanically coupled to the servomotor 68 and is preferably a fifty (50) to one (1) reducer to amplify the moment provided by the servomotor 68. The harmonic drive 70 is mechanically coupled to the servomotor 68 on a first harmonic drive side 73 and mechanically coupled to the flexible coupler 72 on an opposing harmonic drive side 75. The flexible coupler 72 makes the mechanical connection between the harmonic drive 70 and a first friction shaft 76. The counterweight 74 is mechanically coupled to a conveyer bracket 78 on an opposing side of the vacuum conveyer 48 to balance the weight of the servomotor 68 on the flexible coupler 72.

The carrier assembly 62 of the vacuum conveyer 48 preferably includes a first carrier plate 80, a second carrier plate 82, a first sidewall 84, a second sidewall 86, a connector wall 88, a first circular rail 90, and a second circular rail 92. The first carrier plate 80 is mechanically coupled to the first circular rail 90 and moves along the first circular rail 90 in response to the movement created by the motor assembly 60. The second carrier plate 82 is mechanically coupled to the second circular rail 92 and moves along the second circular rail 92. The first circular rail 90 and the second circular rail 92 provide circular motion that ensures no buckling of the flexible tape 10 during z-axis movement of the flexible tape 10 during the printing process. The first circular rail 90 is mechanically coupled to the first sidewall 84 and the second circular rail 92 is mechanically coupled to the second sidewall 86. The first sidewall 84 is mechanically coupled to a first connector wall end 94 of the connector wall 88 and the second sidewall 86 is mechanically coupled to an opposing connector wall end 96, thereby providing rigidity of the carrier assembly 62.

The motion synchronizer 64 of the vacuum conveyer 48 preferably includes a first rack and pinion 98, a second rack and pinion 100, a telescopic coupler 102, the first friction shaft 76 and a second friction shaft 104. The first rack and pinion 98 is mechanically coupled to the z-axis plate 39 (see FIGS. 4 and 5), which causes synchronous movement between the lift of the z-axis plate 39 and the circular movement of the vacuum conveyer 48. The telescopic coupler 102 mechanically couples the second rack and pinion 100 to the first rack and pinion 98. Further, the second rack and pinion 100 assists the vacuum conveyer 48 when the synchronous motion begins.

The conveyer belt 66 of the vacuum conveyer mechanism 48 preferably is an endless belt having a plurality of perforations 106. The conveyer belt 66 is constantly under tension due to the friction between the first friction shaft 76 and the second friction shaft 104.

The vacuum conveyer mechanism 48 in accordance with the present invention and illustrated in FIG. 6 is capable of maintaining a proper tension of the flexible tape 10 without disturbing the fixed position of the flexible circuit 18 being printed. The vacuum conveyor mechanism 48 and the printing platform 50 are both mounted on the same theta steering platform 58 that compensates the change of the direction of the flexible tape 10 during flexible tape advancement. The vacuum is directed through the perforations of the conveyer belt 66 to provide and maintain a contact between the flexible tape 10 and the conveyer belt 66.

When a printing cycle starts after the flexible tape advancement motion is completed, the vacuum on the printing platform 50 is turned on and the printing platform 50 is lifted up towards the solder stencil 35. As soon as the printing platform 50 starts to lift, the vacuum conveyor 48 moves with synchronized motion along the first circular rail 90 and the second circular rail 92, preferably composed of steel segments, in order to prevent the already printed flexible circuit from coming in contact with the solder stencil 35. This circular motion also serves the purpose of maintaining the proper flexible tape tension and avoiding wrinkles in the flexible tape 10.

Figure 7:
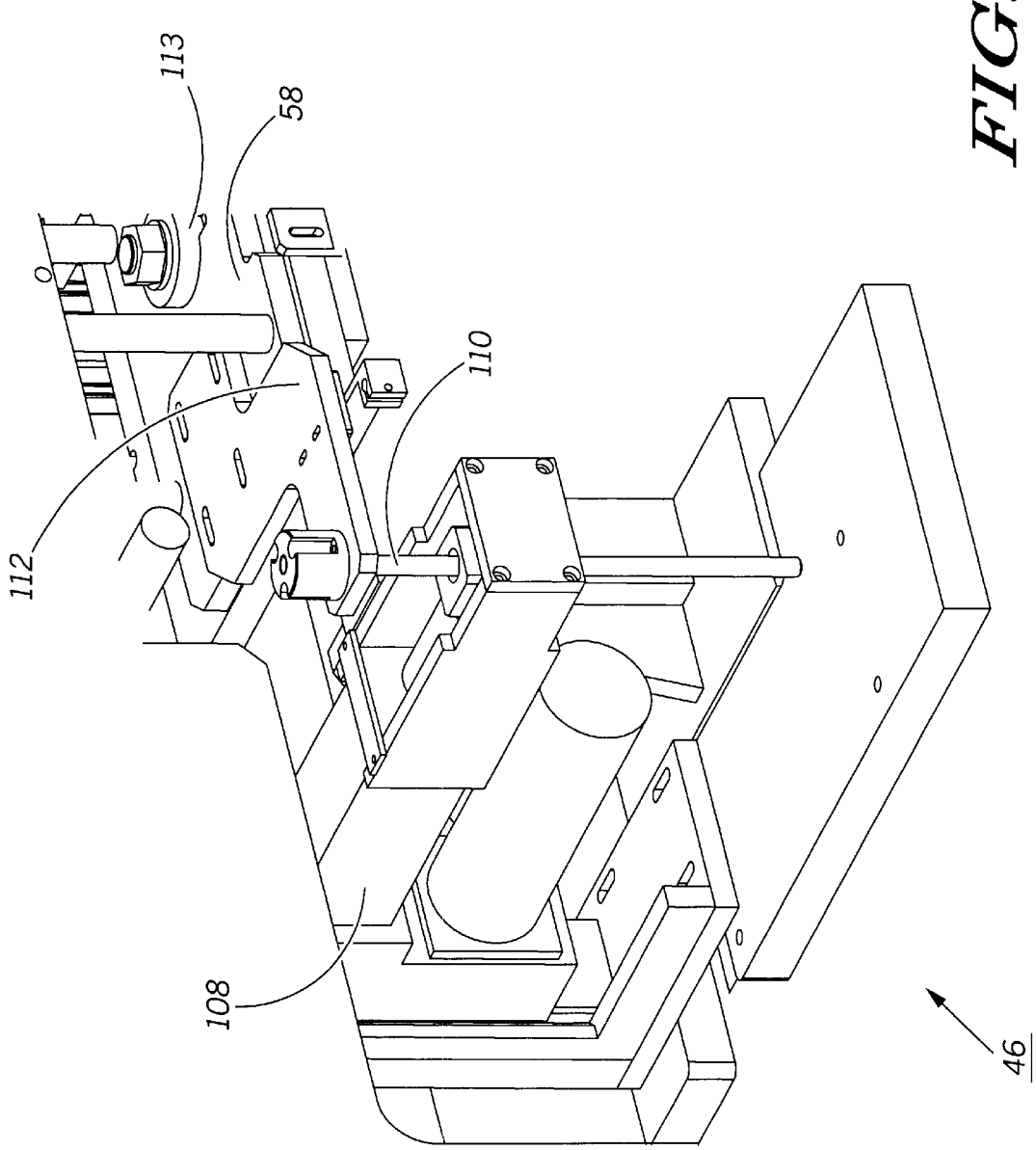
FIG. 7 illustrates a steering mechanism for use in the solder printing apparatus of FIG. 5 in accordance with the present invention.

FIG. 7 illustrates a preferred embodiment of the steering mechanism 46 utilized in the solder printing apparatus 40. The steering mechanism 46 preferably includes a motor 108, a motor connecting rod 110, and a motor connecting plate 112. The motor connecting rod 110 is mechanically coupled to the motor 108. The shaft of the motor 108 moves in and out. The motor connecting rod 110 is mechanically coupled to the motor connecting plate 112. The motor connector plate 112 is mechanically coupled to the theta steering platform 58. When the motor 108 moves in and out, the motor connecting rod 110 forces the motor steering plate 112 attached to the theta steering plate 58 to move around a theta steering bearing 113 mechanically coupled to the theta steering plate 58.

Figure 8:
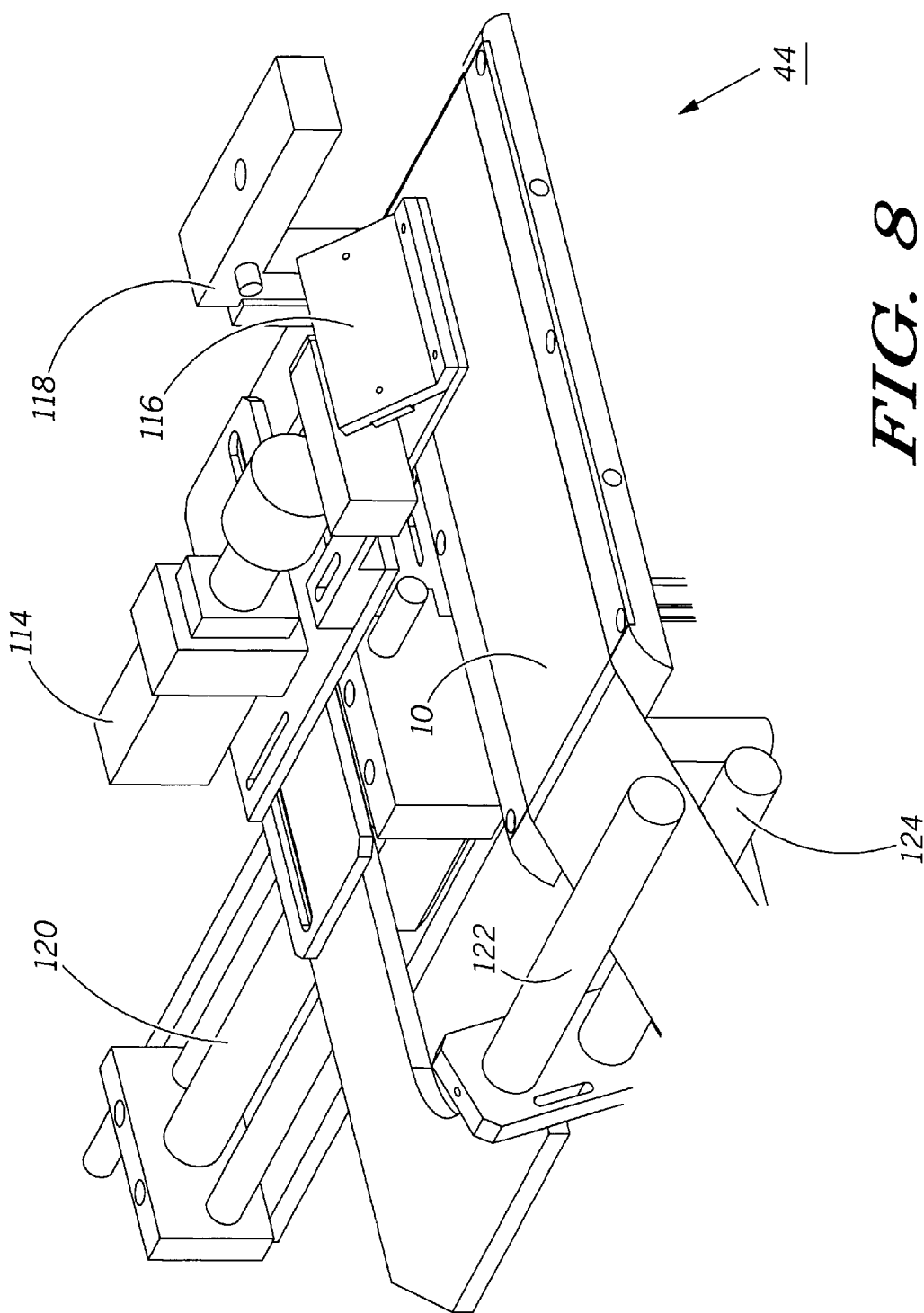
FIG. 8 illustrates a vision and alignment mechanism for use in the solder printing apparatus of FIG. 5 in accordance with the present invention.

FIGS. 8 illustrates a preferred embodiment of the vision and alignment mechanism 44 utilized in the solder printing apparatus 40. As illustrated in FIG. 8, the vision and alignment mechanism 44 preferably includes a camera 114, a mirror 116, an ultrasonic sensor 118, a rodless cylinder 120, a first ionizer 122, and a second ionizer 124. The mirror 116 is preferably mounted at a forty-five (45) degree angle to allow the camera 114 to look at the flexible tape 10. The ultrasonic sensor 118 is preferably a C-shape; and detects the drift of the flexible tape 10 and gives feedback to the steering mechanism 46. The first ionizer 122 and the second ionizer 124 remove static electricity from the flexible tape 10. The rodless cylinder 120 is used to move the vision and alignment mechanism 44 to the home position after flexible tape advancement is completed, thereby allowing the printing process to begin.

Figure 9:
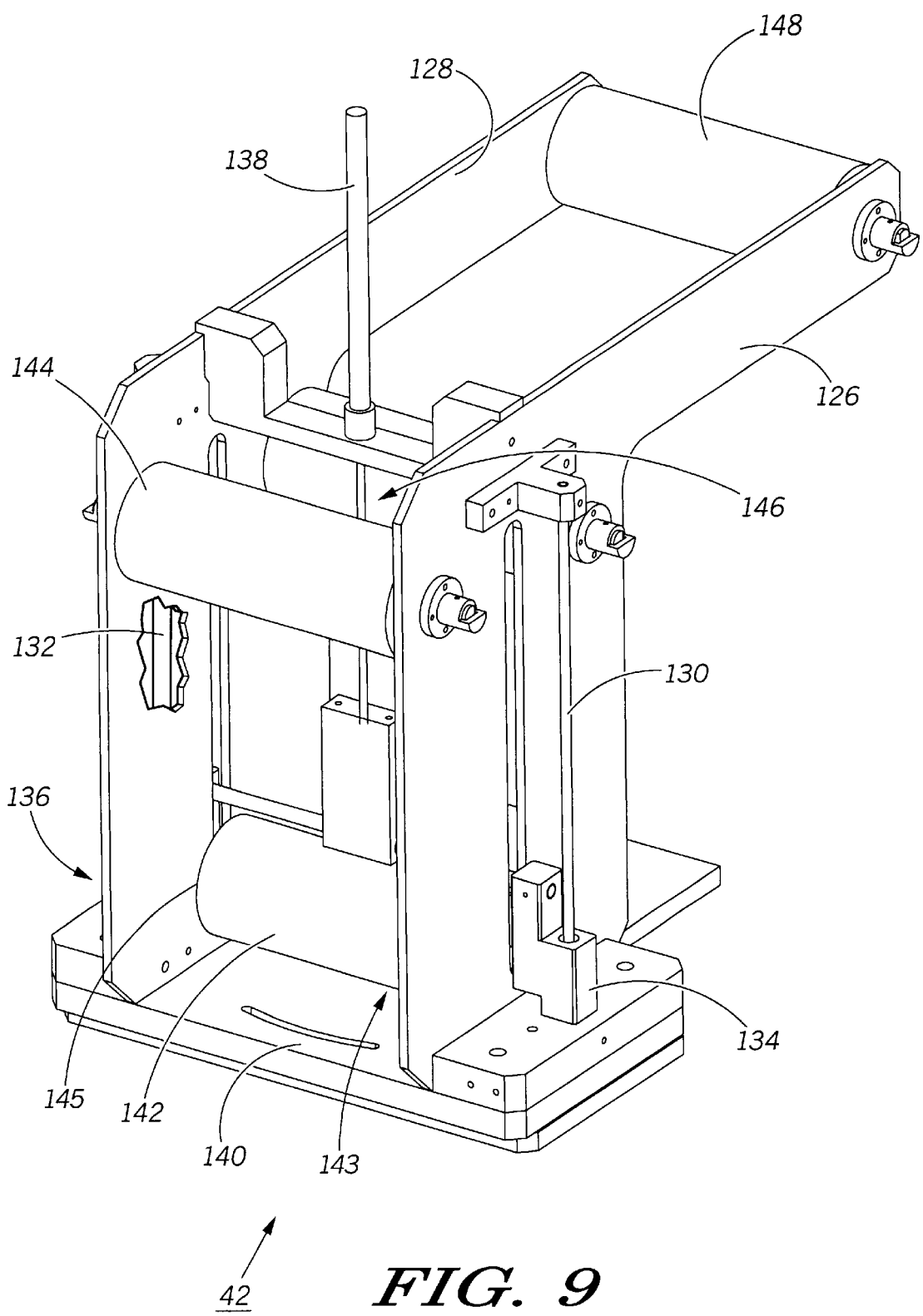
FIG. 9 illustrates a tension roller assembly utilized in the solder printing apparatus of FIG. 5 in accordance with the present invention.

FIG. 9 illustrates a preferred embodiment of the tension roller assembly 42 utilized in the solder printing apparatus 40. The tension roller assembly 42 preferably includes a first frame element 126, a second frame element 128, a first guide rod 130, a second guide rod 132, a first bearing block 134, a second bearing block 136, a pneumatic cylinder 138, a tension roller assembly base plate 140, a tension roller 142, a first idler roller 144, a second idler roller 146, and a third idler roller 148. The first frame element 126 and the second frame element 128 are mechanically coupled to the tension roller assembly base plate 140, thereby providing a sturdy structure for the functioning of the tension roller assembly 42. The first bearing block 134 is mechanically coupled to a first side 143 of the tension roller 142 and moves up and down on the first guide rod 130. The second bearing block 136 (not shown: mechanically equivalent to the first bearing block 134 of FIG. 9) is mechanically coupled to an opposing side 145 of the tension roller 142 and moves up and down on the second guide rod 132.

The tension roller assembly 42, as illustrated in FIG. 9 maintains the flexible tape 10 under constant tension during handling and/or printing. The tension roller 142, the first idler roller 144, the second idler roller 146, and the third idler roller 148 are preferably composed of ultra light 3 inch (76.2 millimeter) diameter rollers balanced at 1500 revolutions per minute (rpm). The tension roller 142 is guided by the first guide rod 130 and the second guide rod 132 and also by the first bearing block 134 and the second bearing block 136. The pneumatic cylinder 138 is attached to the tension roller 142 for better control of the tension of the flexible tape 10.

Figure 10:
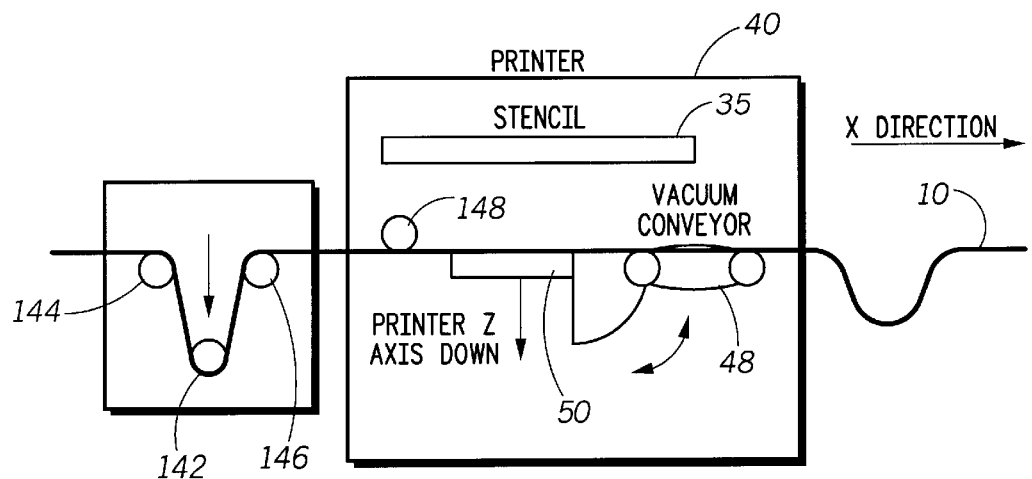
FIGS. 10 and 11 illustrate the operation of the solder printing apparatus of FIG. 5.

FIG. 10 illustrates a side view of the solder printing apparatus 40 during flexible tape advancement prior to and after the printing process takes place. As illustrated in FIG. 10, during processing, the flexible tape 10 moves over the first idler roller 144, then the tension roller 142, then the second idler roller 146 and lastly over the third idler roller 148.

Figure 11:
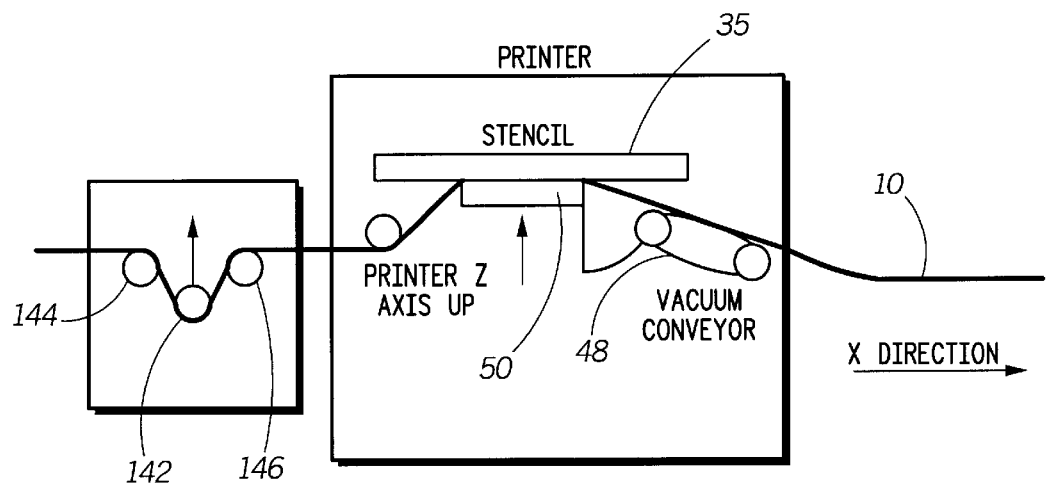

FIG. 11 illustrates a side view of the solder printing apparatus 40 during printing. As illustrated in FIG. 11, when the printing platform 50 is lifted up toward the solder stencil 35 after proper vision alignment by the vision and alignment mechanism 44, the flexible tape 10 prior to the tension roller assembly 42 locks up and the tension roller 142 is lifted up by the flexible tape 10 until the printing platform 50 comes to the desired height, in contact with the solder stencil 35 and is ready for printing. The vacuum on the printing platform 50 is turned on and stays on during printing cycle that includes platform lifting, printing and return to initial position. During platform return cycle, the tension roller 142 lowers itself due to gravity forces, maintaining a constant low tension of the flexible tape 10 until the printing platform 50 reaches the original standby position. The tension roller assembly 42 as herein described provides an independent, stand-alone assembly that can be added along the manufacturing line at any place in which tension is required.

Figure 12:
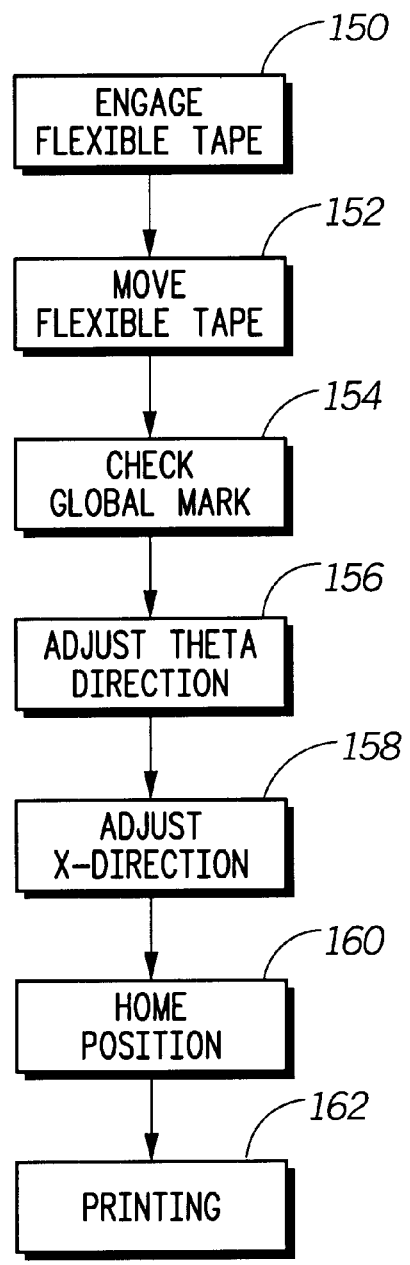
FIG. 12 is a flowchart of the operation of the solder printing apparatus of FIG. 5.

Referring to FIG. 12, the flexible tape advancement sequence is illustrated. In Step 150, the controller engages the flexible tape 10 on the conveyor belt 66 by turning on the vacuum at a relative starting position. Next, in Step 152, the servomotor 68 of the vacuum conveyer 48 then moves the flexible tape 10 in the X direction a specified distance from the starting position. Next, in Step 154, the vision and alignment mechanism 44 checks the global mark 32 on the flexible circuit 18 of the flexible tape 10 that needs to be within calibration range. Next, in Step 156, the steering mechanism 46 adjusts theta direction to bring the target to the desired position. Next, in Step 158 the servomotor 68 of the vacuum conveyer 48 adjusts the x-direction to bring the target to the desired position. In Step 160, when a flexible tape advancement cycle is completed the vision and aligning mechanism 44 retracts to a home position. In Step 162, the printing process including flexible tape alignment begins.

In summary, for manufacturers to fully utilize the future of flexible and cost-effective fine pitch electronic substrates, standard production practices will have to change. The present invention as described herein solves many issues of continuos flexible tape handling, printing, line sequencing, and utilization conventional surface mount device assembly equipment required for future flexible tape manufacturing. The present invention as described herein provides low-tension accurate flexible tape advancement. It is a stand-alone assembly and is easy to utilize with conventional solder printing equipment. The present invention successfully handles the flexible tapes without compromising the quality of the previously printed ones. The present invention also maintains the flexible tape flat during flexible tape advancement and steering. Addressing the issue of presenting a new flexible circuit to the solder stencil without disturbing the already printed flexible circuits and maintaining proper tension of the flexible tape is arguably one of the greatest challenges to use solder printing processing in reel-to-reel assembly. The present invention successfully solves the dependency between the movement of material through the system and the printing process that the material is subjected to.

Although the invention has been described in terms of preferred embodiments, it will be obvious to those skilled in the art that various alterations and modifications can be made without departing from the invention. Accordingly, it is intended that all such alterations and modifications be considered as within the spirit and scope of the invention as defined by the appended claims.

What is claimed is:

1. A solder printing apparatus for use within a solder printer having a z-axis plate and a solder stencil for printing solder on a flexible circuit contained with a flexible tape, the solder printing apparatus comprising:

a vision and alignment mechanism for controlling the position of the flexible tape, wherein the vision and alignment mechanism sends a signal to a steering mechanism;

a theta steering platform for compensating the change of direction of the flexible tape;

the steering mechanism, mechanically coupled to the theta steering platform, wherein the steering mechanism adjusts the position of the flexible tape in response to receiving the signal from the vision and alignment mechanism;

a printing platform, mechanically mounted on the theta steering platform, wherein the printing platform is lifted up using the z-axis plate in response to the steering mechanism adjusting the position of the flexible tape;

a vacuum conveyer, mechanically mounted on the theta steering platform, wherein the vacuum conveyer holds and advances the flexible tape, and further wherein the vacuum conveyer moves along a circular pair of tracks when the printing platform is lifted; and a tension roller assembly for maintaining tension in the flexible tape while the z-axis plate moves the printing platform and the flexible tape upwards towards the solder stencil.

2. The solder printing apparatus as recited in claim 1 wherein the tension roller assembly comprises:

a tension roller assembly base plate;

a first frame element, mechanically coupled to the tension roller base plate for providing a sturdy structure for the functioning of the tension roller assembly;

a second frame element, mechanically coupled to the tension roller assembly base plate for providing a sturdy structure for the functioning of the tension roller assembly;

a first guide rod;

a second guide rod;

a tension roller, mechanically coupled to a first bearing block and a second bearing block, wherein the tension roller movement is guided by the first guide rod, the second guide rod, the first bearing block and the second bearing block, wherein the tension roller receives the flexible tape from a first idler roller;

the first bearing block, mechanically coupled to a first side of the tension roller and to the first guide rod, wherein the first bearing block moves up and down on the first guide rod;

the second bearing block, mechanically coupled to an opposing side of the tension roller and to the second guide rod, wherein the second bearing block moves up and down on the second guide rod;

a pneumatic cylinder, mechanically coupled to the tension roller, wherein the pneumatic cylinder provides control of the tension of the flexible tape;

the first idler roller, wherein the flexible tape moves over the first idler roller;

a second idler roller, receiving the flexible tape from the tension roller, wherein the flexible tape moves over the second idler roller; and a third idler roller, receiving the flexible tape from the second idler roller, wherein the flexible tape moves first over the first idler roller.

3. The solder printing apparatus as recited in claim 1 wherein the vision and alignment mechanism comprises:

a camera, for looking at the flexible tape;

a mirror, wherein the mirror is mounted on the vacuum conveyer to allow the camera to look at the flexible tape;

an ultrasonic sensor, wherein the ultrasonic sensor detects the drift of the flexible tape and gives feedback to the steering mechanism;

a rodless cylinder, for moving the vision and alignment mechanism to a home position after flexible tape advancement;

a first ionizer, for removing static electricity from the flexible tape; and a second ionizer, for removing static electricity from the flexible tape.

4. The solder printing apparatus as recited in claim 1 wherein the steering mechanism comprises:

a motor having a shaft, wherein the shaft of the motor moves in and out;

a motor connecting rod, mechanically coupled to the motor and mechanically coupled to a motor connecting plate; and the motor connecting plate, mechanically coupled to the theta steering platform, wherein the motor connecting rod forces a motor steering plate attached to the theta steering plate to move around a theta steering bearing mechanically coupled to the theta steering plate in response to the shaft of the motor moving in and out.

5. The solder printing apparatus as recited in claim 1 wherein the vacuum conveyer comprises:

a motor assembly for providing power to drive the movement of a conveyer belt;

a carrier assembly, mechanically coupled to the motor assembly, for providing a rigid carrier for the functioning of the vacuum conveyer;

a motion synchronizer, mechanically coupled to the carrier assembly, for providing synchronous movement of the vacuum conveyer and the z-axis plate ; and a conveyer belt, wherein the flexible tape rests on top of the conveyer belt and further wherein the conveyer belt moves in response to the power provided by the motor assembly.

6. The solder printing apparatus as recited in claim 5 wherein the motor assembly comprises:

a servomotor for producing the power to drive the conveyer belt;

a harmonic drive, mechanically coupled to the servomotor on a first harmonic drive side and mechanically coupled to a flexible coupler on an opposing harmonic drive side, wherein the harmonic drive amplifies a moment provided by the servomotor;

the flexible coupler, providing the mechanical connection between the harmonic drive and a first friction shaft; and a counterweight, mechanically coupled to a conveyer bracket on an opposing side of the vacuum conveyer to balance the weight of the servomotor on the flexible coupler.

7. The solder printing apparatus as recited in claim 5 wherein the carrier assembly comprises:

a first sidewall;

a second sidewall;

a connector wall having a first connector wall end and an opposing connector wall end, wherein the first sidewall is mechanically coupled to a first connector wall end of the connector wall, and further wherein the second sidewall is mechanically coupled to an opposing connector wall end, for providing rigidity of the carrier assembly;

a first circular rail, wherein the first circular rail is mechanically coupled to the first sidewall;

a second circular rail, wherein the second circular rail is mechanically coupled to the second sidewall;

a first carrier plate, wherein the first carrier plate is mechanically coupled to the first circular rail and moves along the first circular rail in response to the movement created by the motor assembly; and a second carrier plate, wherein the second carrier plate is mechanically coupled to the second circular rail and moves along the second circular rail in response to the movement created by the motor assembly.

8. The solder printing apparatus as recited in claim 5 wherein the motion synchronizer comprises:

a first rack and pinion, mechanically coupled to the z-axis plate for creating synchronous movement between the lift of the z-axis plate and the circular movement of the vacuum conveyer;

a second rack and pinion, for assisting the movement of the vacuum conveyer during synchronous motion of the vacuum conveyer;

a telescopic coupler, wherein the telescopic coupler mechanically couples the second rack and pinion to the first rack and pinion;

the first friction shaft; and a second friction shaft, wherein a friction between the first friction shaft and the second friction shaft cause the conveyer belt to be under tension.

9. The solder printing apparatus as recited in claim 5 wherein the conveyer belt is an endless belt having a plurality of perforations.

* * * * *